United States Patent [19]

Tomida et al.

[11] Patent Number: 4,798,740

[45] Date of Patent: Jan. 17, 1989

[54] POLYMERIZABLE FILM AND PATTERN FORMING METHOD BY USE THEREOF

[75] Inventors: Yoshinori Tomida, Atsugi; Kunihiro Sakai, Yamato; Hiroshi Matsuda, Atsugi; Haruki Kawada, Atsugi; Ken Eguchi, Atsugi; Toshiaki Kimura, Sagamihara; Kiyoshi Takimoto, Atsugi; Kenji Saitoh, Yokohama; Toshihiko Miyazaki, Atsugi, all of Japan

[73] Assignee: Canon Kabushiki Kaisha, Tokyo, Japan

[21] Appl. No.: 30,364

[22] Filed: Mar. 26, 1987

[30] Foreign Application Priority Data

Mar. 31, 1986 [JP] Japan .................................. 61-73111
Mar. 31, 1986 [JP] Japan .................................. 61-73112
Apr. 3, 1986 [JP] Japan .................................. 61-77023

[51] Int. Cl.$^4$ ........................ B05D 3/06; G03C 1/76; G03C 1/71
[52] U.S. Cl. .................................. 427/43.1; 427/54.1; 430/270; 430/281
[58] Field of Search ............................ 427/43.1, 54.1; 430/270, 281

[56] References Cited

U.S. PATENT DOCUMENTS

| | | | |
|---|---|---|---|
| 4,531,809 | 7/1985 | Carter et al. | 430/321 |
| 4,539,061 | 9/1985 | Sagiv | 427/207.1 |
| 4,554,076 | 11/1985 | Speaker | 210/639 |
| 4,562,141 | 12/1985 | Tieke | 430/281 |
| 4,693,915 | 9/1987 | Matsuda et al. | 430/270 |

Primary Examiner—Norman Morgenstern
Assistant Examiner—Marianne L. Padgett
Attorney, Agent, or Firm—Fitzpatrick, Cella, Harper & Scinto

[57] ABSTRACT

A polymerizable film is provided which comprises a transition metal and a polymerizable compound, and having a solubility in a solvent which changes through a maximum and a minimum repeatedly with an increase in energy imparted for polymerization. The polymerized film may comprise a polymerizable compound represented by the formula:

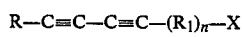

R—C≡C—C≡C—(R$_1$)$_n$—X wherein R and R$_1$ are hydrophobic sites, X is a hydrophilic site, and n is 0 or 1. This polymerizable film is useful as recording materials and resist materials.

47 Claims, 4 Drawing Sheets

POLYMERIZABLE FILM AND PATTERN FORMING METHOD BY USE THEREOF

BACKGROUND OF THE INVENTION

1. Field of the Invention

This invention relates to a polymerizable film by use of a polymerizable compound, particularly a polymerizable film suitable for recording materials, and resist materials. Also, the present invention relates to a pattern forming method by use of the polymerizable film, particularly to a pattern forming method, suitable for formation of a negative-type and positive-type pattern. Also, the present invention relates to a pattern forming method suitable for forming a negative-type and positive-type pattern in a multi-layer resist system.

2. Prior Art

In the prior art, the resist for formation of a fine pattern in production of a semiconductor device has been coated on a substrate according to such a method as spin coating, bar coating, etc.

The coating method of the prior art, however, involves the following drawbacks.

1. Pre-treatment, post-treatment such as prebaking, postbaking, etc., are necessary.
2. Film quality, film thickness are nonuniform.
3. Adhesion to a substrate is weak.
4. Sensitivity and resolving power are limited. In contrast to these methods, in recent years, studies have been made about resist films having uniform film quality and thickness and also exhibiting excellent adhesion to substrates by preparing the resist material according to the monomolecular film built-up method (Langmuir-Blodgett's method).

For example, there is the study in which the monomolecular film of $\omega$-tricosenic acid and its calcium salt is used as the negative-type resist film (A. Barloe et al, Journal of Colloid and Interface Science, vol. 62, No. 3).

However, this resist film had about the same extent of sensitivity as that of the prior art (50 $\mu C/cm^2$), and was not satisfactory.

On the other hand, when a film is formed on a silicon wafer or aluminum vapor-deposited film by a monomolecular film built-up method, the film will come off due to poor adhesion to the substrate whereby built-up of the films could not easily conducted. Further, the film also will come off during development after polymerization. Thus it is not practically acceptable.

Electron beam drawing is generally poor in throughput, and accordingly enhancement of the sensitivity is an important problem for improvement in productivity and cost down.

SUMMARY OF THE INVENTION

Accordingly, the present invention has been accomplished to cancel such drawbacks of the prior art.

An object of the present invention is to provide a novel polymerizable film which can be used particularly for a resist, a recording material of high sensitivity and high resolving power.

Also, it is another object of the present invention to provide a pattern forming method capable of forming particularly a pattern of high sensitivity and high resolving power.

Still another object of the present invention is to provide a pattern forming method capable of forming easily a positive type and negative type pattern.

Further, still another object of the present invention is to provide a pattern forming method capable of forming easily a positive type and negative type pattern in a multi-layer resist system.

According to an aspect of the present invention, there is provided a polymerizable film, comprising a transition metal and a polymerizable compound, and having a solubility in a solvent which changes through a maximum and a minimum with an increase in energy imparted for polymerization.

According to another aspect of the present invention, there is provided a polymerizable film, comprising a transition metal and a polymerizable compound represented by the formula (I) shown below, and also having a solubility in a solvent which changes through a maximum and a minimum with an increase in energy imparted for polymerization:

$$R-C\equiv C-C\equiv C-(R_1)_n-X \qquad (I)$$

wherein R and $R_1$ are hydrophobic sites, X is a hydrophilic site, and n is 0 or 1.

According to a still another aspect of the present invention, there is provided a polymerizable film comprising a transition metal and a polymerizable compound, and being capable of giving rise to a first soluble state and a second soluble state correspondirg to the amount of polymerization energy imparted.

According to a further aspect of the present invention, there is provided a polymerizable film having a layer containing a transition metal and a polymerizable compound and an intermediate layer, said layer containing the transition metal and the polymerizable compound being a polymerizable film which changes repeatedly in solubility in a solvent through a maximum and a minimum with increase of energy given for polymerization.

According to a still further aspect of the present invention, there is provided a pattern forming method, comprising a step of imparting energy to a polymerizable film comprising a transition metal and a polymerizable compound, said film passing repeatedly through a soluble state and an insoluble state in a solvent with an increase in energy imparted, thereby forming a soluble site and an insoluble site.

According to a still further aspect of the present invention, there is provided a pattern forming method, comprising a step of imparting an energy to a polymerizable film comprising a transition metal and a polymerizable compound and passing repeatedly through a soluble state and an insoluble state with increase in energy imparted, thereby forming a first insoluble site and a second soluble site.

According to a still further aspect of the present invention, there is provided a pattern forming method, comprising a step of imparting energy to a polymerizable film comprising a transition metal and a polymerizable compound and passing through repeatedly a soluble state and an insoluble state.

According to a still further aspect of the present invention, there is provided a pattern forming method, comprising a step of providing a layer comprising a monomolecular film of a polymerizable compound containing a transition metal or a built-up film thereof by way of an intermediate layer on a substrate, and a step of polymerizing in shape of a pattern by imparting energy to said layer.

According to a still further aspect of the present invention, there is provided a pattern forming method, comprising a step of providing a layer comprising a monomolecular film of a polymerizable compound containing a transition metal or a built-up film thereof and passing repeatedly through a soluble state and an insoluble state with increase in energy imparted by way of an intermediate layer provided on a substrate, and a step of imparting an energy to said layer, thereby forming a first insoluble site and a second soluble site.

According to a still further aspect of the present invention, there is provided a pattern forming method, comprising a step of providing on a substrate by way of an intermediate layer a layer comprising a monomolecular film of a polymerizable compound containing a transition metal or a built-up film thereof and passing through a soluble state and an insoluble state with increase in energy imparted, and a step of imparting an energy to said layer, thereby forming a second solubilized site and a second insolubilized site.

According to a still further aspect of the present invention, there is provided a pattern forming method, comprising a step of providing a layer having a polymerizable compound and a layer having a transition metal by way of an intermediate layer on a substrate, and a step of polymerizing the compound in a pattern by imparting an energy to said polymerizable compound layer.

BRIEF DESCRIPTION OF THE DRAWINGS

FIGS. 4A and 4B show schematically illustrations of the resist layer formed on the substrate in that

DETAILED DESCRIPTION OF THE INVENTION

The polymerizable film of the present invention comprises primarily a polymerizable compound and a transition metal.

The polymerizable compound used in the present invention is a compound having at least one each of hydrophilic sites, hydrophobic sites and polymerizable sites in the molecule.

As the polymerizable compound according to the present invention, diacetylene compounds may be preferably employed.

The diacetylene compounds are represented by the following formula (I).

$$R-C\equiv C-C\equiv C-(R_1)_n-X \quad (I)$$

wherein R and $R_1$ denotes hydrophobic sites, X denotes a hydrophilic site, and n means 0 or 1.

As the hydrophobic site R, there may be included, for example, alkyl group, olefinic hydrocarbon group such as vinyl, vinylidene, ethynyl, etc., phenyl, fused polycyclic phenyl group such as naphthyl, anthranyl, etc., chain polycyclic phenyl group such as biphenyl, terphenyl, etc., hydrogen atom or other non-polar groups, and as $R_1$, there may be employed an alkylene group, a phenylene group, etc. Particularly, it is preferable that the total number of carbon atoms in R and $R_1$ should be preferably 10 to 30.

As the hydrophilic site X, preferable are a carboxylic group and metal salts or amine salts thereof, a sulfonic acid group and metal salts or amine salts thereof, a sulfamide group, an amide group, an amino group, an imino group, a hydroxy group, a quaternary amino group, an oxyamino group, a diazonium group, a guanidine group, a hydrazine group, a phosphoric acid group, a silicic acid group, an aluminic acid group, a nitrile group, a thioalcohol group, and other polar groups, etc.

On the other hand, as the transition metal used in the present invention, there may be included chromium, manganese, iron, cobalt, nickel, copper, zinc, cadmium, etc., particularly preferably manganese.

These transition metals may exist in either state of ion, complex of salt in the film.

Figure 1A:
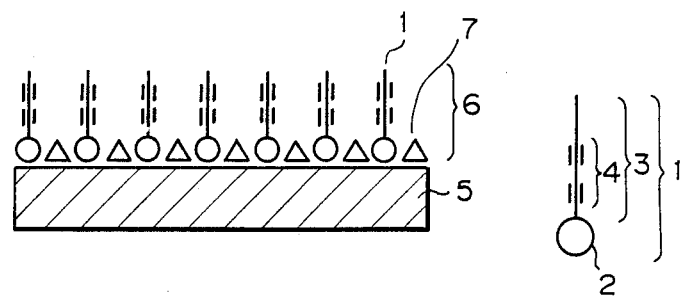
FIGS. 1A and 1B are schematic illustrations showing the polymerizable film of the present invention.
Figure 1B:
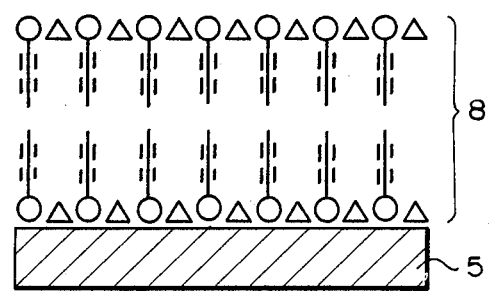

FIGS. 1A and 1B are schematic illustrations showing an example of the polymerizable film of the present invention provided on a substrate.

FIG. 1A represents a polymerizable film comprising a monomolecular film, and FIG. 1B a polymerizable film comprising a monomolecular built-up film.

A polymerizable film (a monomolecular film 6, a monomolecular built-up film 8) containing a polymerizable compound 1 having a hydrophilic site 2, a hydrophobic site 3 and a polymerizable site 4 and a transition metal 7 is formed on a substrate 5.

As a method for preparing a polymerizable film of the present invention, there may be employed a spinner rotary coating method, a roller coating method, a drawing-up coating method, a sputtering method, a plasma polymerization method, a monomolecular built-up method, etc. When high density and high orderliness of the film prepared are taken into consideration, particularly the monomolecular built-up method is preferred.

As the method for forming a monomolecular film or a built-up film thereof having such high orderliness and high orientation of molecules, for example, there may be employed the Langmuir-Blodgett's technique developed by I. Langmuir et al (hereinafter called LB technique).

The LB method is a method for preparing monomolecular films or built-up films thereof by employing a molecule having a hydrophilic portion and a hydrophobic portion in the molecule in which hydrophilicity and hydrophobicity are well balanced, and utilizing the orientation of the molecule on a water surface with a hydrophilic group directing downward.

The monomolecular layer formed on the water surface has the characteristic of a two-dimensional system. When the molecules are dispersed sparsely, the equation of a two-dimensional ideal gas is valid between the area A for one molecule and the surface pressure $\pi$, thus becoming "a gaseous film":

$$\pi A = KT.$$

wherein K is the Boltzman's constant and T is an absolute temperature.

When A is made considerably small, the interaction between the molecules becomes larger, whereby the film turns "condensed film (or solid film)" of a two-dimensional solid. The condensed film can be transferred one by one onto the surface of a carrier made of various materials in various shapes such as a glass substrate.

Figure 3A:
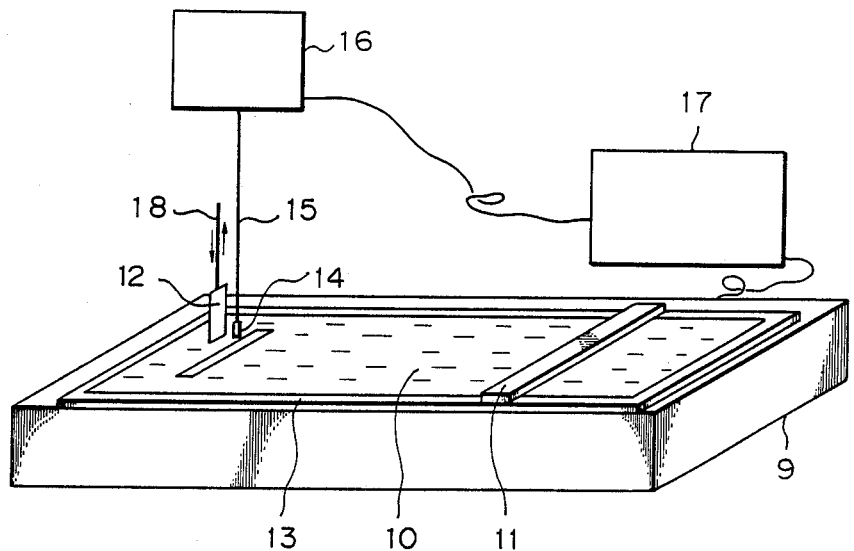
FIGS. 3A and 3B are a perspective view and a sectional view of a device for preparation of the polymerizable film of the present invention.
Figure 3B:
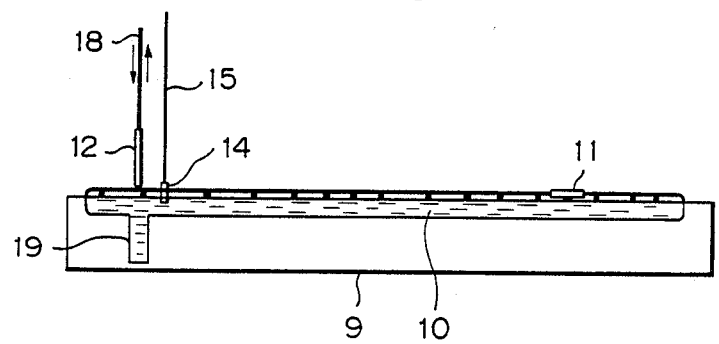

Referring now to FIG. 3, the specific method for preparing a monomolecular film or its built-up film of a diacetylene compound constituting the polymerizable film of the present invention according to this method is described below.

First, a desired diacetylene compound 1 is dissolved in a volatile solvent such as benzene, chloroform, etc.

The solution of this diacetylene compound 1 is spread over the aqueous phase 10 in a water tank 9 to form a film.

Next, the spreading area is restricted by providing a partitioning plate (or buoy) 11 so that the spread layer may not expand by free diffusion over the aqueous phase 10, thereby controlling the gathered state of the film substance to obtain a surface pressure $\pi$ which is in proportion to the gathered state.

By moving this partitioning plate 11, the spreading area can be reduced to control the gathered state of the film substance, to increase the surface pressure gradually to reach a surface pressure $\pi$ which is suitable for a production of a built-up film.

By moving vertically a clean carrier (or a substrate) 12 gently while maintaining this surface pressure, a monomolecular film of the diacetylene compound is transferred onto the carrier (substrate) 12.

The monomolecular film of the diacetylene compound is produced as described above, and by repeating the above operation, a built-up film of monomolecular film of the diacetylene compound made of desired built-up number of films can be formed.

For transfer of the diacetylene monomolecular film onto the carrier 12, other than the vertical dipping method as described above, there are methods according to the horizontal lifting method, the rotatory cylinder method, etc.

The horizontal lifting method is a method for transferring the film by bringing the carrier (substrate) 12 into contact horizontally with the water surface, while the rotatory cylindrical method is a method for transferring the film onto the carrier surface by rotating a cylindrical carrier on the water surface.

In the vertical dipping method as described above, when a carrier 12 with hydrophilic surface is withdrawn from water in the direction transversing the water surface, a diacetylene monomolecular film is formed on the carrier with the hydrophilic site 2 of the diacetylene compound directed toward the carrier side.

When the carrier is moved vertically, the diacetylene monomolecular film is laminated by one layer in each step.

In this case, since the direction of the film forming molecule is reversed in the withdrawing step and the dipping step, the Y type film in which the hydrophilic site 2 and the hydrophilic site 2 of the diacetylene derivative are opposed to each other in adjacent layers is formed according to this method.

In contrast, according to the horizontal lifting method, the diacetylene monomolecular film with the hydrophobic site 3 of the diacetylene compound 1 directed toward the carrier side is formed on the carrier.

According to this method, even when the film is built-up, there is no alternation in the direction of the film forming molecule, but the X-type in which the hydrophobic site 3 is directed toward the carrier side in all the layers is formed. On the contrary, the built-up film in which the hydrophilic site 2 is directed toward the carrier side in all the layers is called the Z-type film.

The method for transferring the monomolecular layer onto a carrier is not limited to these, but it is also possible to extrude a carrier into an aqueous phase from a carrier roll when a large area of a carrier is desired. The direction of the hydrophilic site and the hydrophobic site as described above is a general principle, and it can be changed by the surface treatment of the carrier, etc.

In the present invention, as the method for incorporating the transition metal in a monomolecular film or a built-up film of the diacetylene derivative compound, there may be included:

1. a method in which a film is formed by use of a transition metal salt of a diacetylene compound;
2. a method in which a solution containing a transition metal is dissolved in the aqueous phase 10, and the transition metal is incorporated into the film in the step of building up monomolecular films;
3. the method in which after preparation of a monomolecular built-up film, said built-up film is dipped in a solution containing a transition metal, etc., and any method can be used to accomplish the objects of the present invention.

In the present invention, it is also possible to attach a transition metal or a transition metal compound onto a substrate according to the method such as vapor deposition or electrolytic plating, and form a monomolecular built-up film of a diacetylene derivative compound thereon.

As the substrate or carrier for forming a polymerizable film, there may be employed various solid materials such as glass, plastic, paper, metal, etc., but when utilizing the polymerizable film of the present invention, for example, a resist film, silicon wafer or silicon wafer having aluminum vapor deposited film or chromium vapor deposited film on the surface, etc., may be preferably used as the substrate.

The polymerizable film of the present invention may be a polymerizable thin film having a film thickness of generally some 10 Å to about some $\mu$m, preferably 100 Å to 5000 Å. The preferable thickness depends on the uses of the film.

In the present invention, the polymerizable film may be provided by way of an intermediate layer on the substrate and pattern formation may be effected by imparting an energy to said layer.

Figure 4:
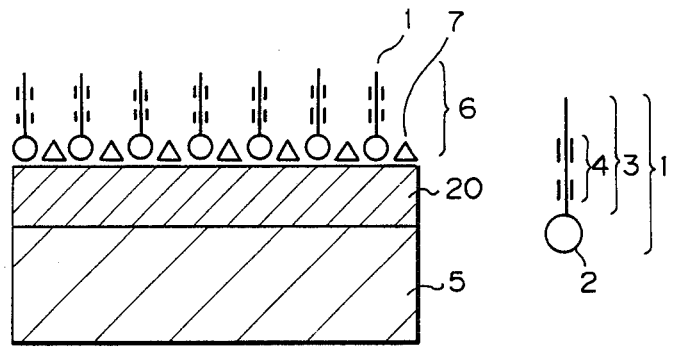
Figure 4:
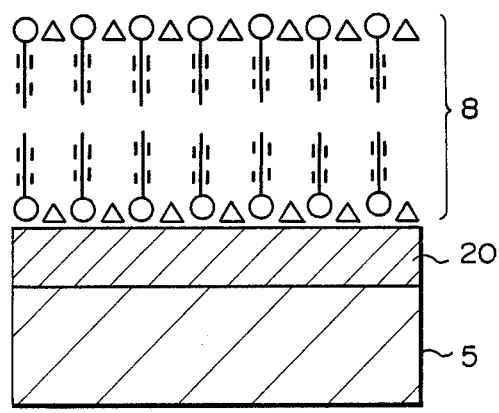

FIGS. 4A and 4B show schematically illustrations of the resist layer formed on the substrate in that embodiment. The layers 6, 8 provided by way of the intermediate layer 20 comprise primarily a polymerizable compound 1 and a transition metal 7.

The intermediate layer employed in the present invention may be one used in a conventional multi-layer resist system, including one-layr constitution comprising a photoresist layer or two-layer constitution comprising a photoresist layer and a layer of an inorganic material.

As the material constituting the photoresist layer, any of compounds conventionally used as a positive type, and a negative type of resist material known in the art can be preferably used.

For example, as the positive type of resist material, there may be included polymethacrylates such as polymethyl methacrylate, polyethyl methacrylate, etc., polymers and copolymers of methyl $\alpha$-chloroacrylate, vinylidene chloride copolymers, polymethyl $\alpha$-trifluoromethyl acrylate, polymethacrylamide, poly-t-butyl methacrylate, etc. On the other hand, as the negative type of resist material, there may be included polyglycidyl methacrylate, glycidyl methacrylate-ethyl actylate, MMA-ethylacrylate-glycydyl methacrylate ternary copolymer of which a part of glycidyl groups are reacted with methacrylic acid, etc.

As the material constituting the inorganic material layer, Si, Ti, siloxane, etc., may be employed.

In the present invention, as the method for forming an intermediate layer on the substrate 5, there may be employed a spinner rotatory coating method, a roller coating method, a drawing-up coating method, a sputtering method, a plasma polymerization method, a monomolecular built-up method, etc.

The intermediate layer of the present invention preferably comprises a photoresist layer having a thickness of about 1 to 3 μm, and the inorganic layer, having a thickness of about 0.1 to 0.5 μm.

Figure 2:
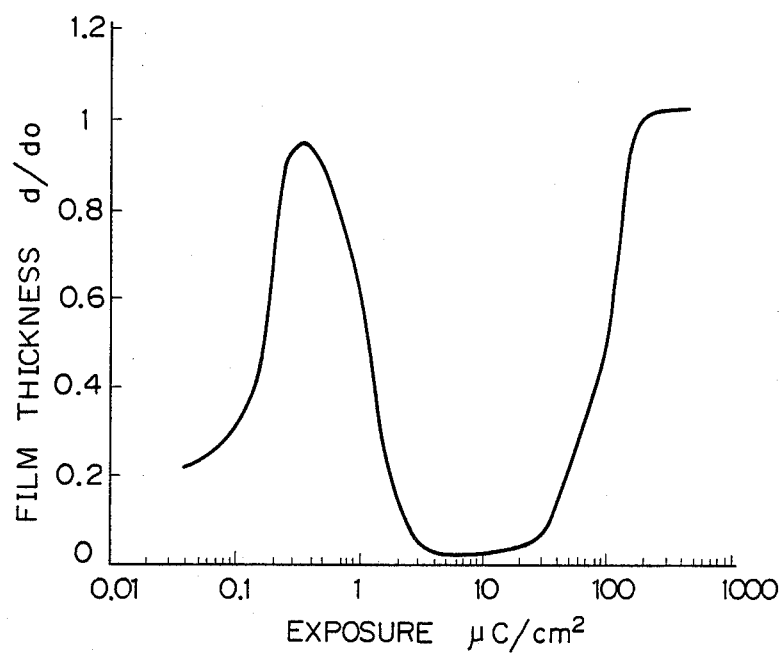
FIG. 2 is a graph showing the curve of normalized film thickness of polymerizable film versus electron beam dose.

The dependency of the solubility of the polymerizable film in a solvent on the dose of energy for polymerization to the film is illustrated in FIG. 2. The film thickness therein is a normalized value after the dose of the energy and the development (namely, thickness of the remaining film).

FIG. 2 illustrates the change of the solubility of the polymerizable film containing manganese and a diacetylene compound in ethanol as a solvent passing through a maximum and a minimum with increasing exposure to an electron beam.

The solubility is high before exposure to an electron beam (namely a first soluble state). The solubility changes with increasing exposure through an insoluble state (a first insoluble state), a soluble state (a second soluble state), and an insoluble state (a second insoluble state). The solubility is higher in the second soluble state than in the first soluble state.

The pattern-forming method of the present invention is based on the characteristics of the above polymerizable film, and embodiment as shown below are included:

1. the embodiment in which a negative type pattern is formed by utilizing the difference in solubility between the electron-beam-unexposed portion (a first soluble site) and the first insoluble site;

2. the embodiment in which a positive type pattern is formed by utilizing the difference in solubility between the first insoluble site and the second soluble site;

3. the embodiment in which a negative type pattern is formed by utilizing the difference in solubility between the second soluble site and the second insoluble site.

Although any of these embodiments may be preferably utilizable, the second and the third embodiments are preferred in which the difference in solubility in the solvent is particularly great.

The polymerization energy to be used in the present invention may include heat, a near UV-ray, a UV-ray, a far UV-ray, an electron beam, a soft X-ray, an X-ray and other electromagnetic waves, and at least one of them may be used.

The solvent to be used for development may include water or organic solvent such as methanol, ethanol, acetone, etc.

In the present invention, developing treatment is essential in pattern formation, but no developing treatment is necessarily required in such a case where the subbing layer is subjected to etching subsequent to the pattern formation. The soluble site formed by imparting of energy has extremely low resistance to etching, the film can be easily peeled off during etching without performing development.

For etching of the subbing layer, carbon tetrafluoride plasma, oxygen plasma, etc., known in the art may be employed.

In order to describe the present invention in more detail, Examples are set forth below.

EXAMPLE 1-2

As the aqueous phase 10, a solution was prepared by dissolving manganese chloride tetrahydrate in pure water at a concentration of $1 \times 10^{-4}$M and further potassium hydrogen carbonate to $5 \times 10^{-5}$M, followed by adjustment of pH 6.4. The water temperature was controlled to be maintained at 20° C.

As the diacetylene compound, 10, 20-pentacosadiynoic acid represented by the following formula:

$$C_{12}H_{25}-C{\equiv}C-C{\equiv}C-C_8H_{16}-COOH$$

was dissolved at a concentration of $1 \times 10^{-3}$M in chloroform, and 200 μl of the solution was spread over the aqueous phase 10.

After evaporation of the solvent chloroform, the partitioning plate 11 was moved to enhance the surface pressure to 20 mN/m.

As the substrate 12, an n+ type silicon wafer doped with antimony (resistance value 0.010–0.011 Ωcm$^{-1}$) from which oxide film on the surface had been removed with hydrofluoric acid was employed.

This substrate was moved gently upward and downward at a speed of 10 mm/min in the direction transversing the water surface to form a monomolecular built-up film of 30 layers.

When the monomolecular film on the aqueous phase is transferred onto the substrate, the surface pressure of the monomolecular film on the aqueous phase is lowered. Accordingly, in order to maintain the surface pressure at a constant level, the surface pressure is monitored by a surface pressure meter 16 connected through the surface pressure paper 14 and the suspending yarn 15, and the partitioning plate 11 is moved through the control circuit system 17.

As the result of measurement of the monomolecular built-up film formed according to the above method by X-ray scattering and atomic absorption analysis, the molecular built-up film was found to have a layered structure with a thickness of one layer of 31 Å, and it was confirmed that manganese was incorporated as the carboxylic acid salt of the diacetylene compound.

The polymerizable film thus formed on the substrate was dried in air for 24 hours.

The polymerizable film formed on the substrate as described above was placed in an electron beam lithography system ELS-3300 produced by Elionix Co., and drawing was conducted by use of a pattern generating device under the conditions of an accelerating voltage of 20 KV, current values of $1 \times 10^{-10}$ A and $1 \times 10^{-11}$ A. The magnification at this time was 50-fold, with the stationary spot diameter being 0.1 μm in diameter and the delivery pitch being 0.1 μm.

After drawing by setting the exposure time at 0.5 μsec/spot–256 μsec/spot, development was effected in ethanol and the film thickness after development was measured by ellipsometry by use of 633 nm helium-neon laser (produced by Gaertner Scientific Corp.) to prepare a sensitivity curve. The results are shown in Table 2.

As shown in FIG. 2, $D_{0.5}$ (the exposure dose for 50% remaining thickness) of the film after development became 0.5 $\mu C/cm^2$ or less, thus showing higher sensitivity by far than the resist film (50 $\mu C/cm^2$) by use of the monomolecular film of $\omega$-tricosenic acid of the prior art.

Next, after drawing lines with a line thickness and interlinear space of 1 $\mu m$–0.1 $\mu m$ on the polymerizable film at electron beam doses of 0, 0.4, 8, and 200 $\mu C/cm^2$, respectively, development processing in ethanol was effected for 5 minutes, and the normalized value of the film thickness after development was compared.

The remaining film was less in amount at the exposed portion with a dose of 8 $\mu C/cm^2$ than at the unexposed portion with a dose of 0 $\mu C/cm^2$, and the contrast relative to the exposed portions with doses of 0.4 $\mu C/cm^2$ and 200 $\mu C/cm^2$ was higher. Moreover, a pattern with a resolving power of 0.2 $\mu m$ could be also formed.

EXAMPLE 1-2

As the aqueous phase 10, pure water was employed and potassium hydrogen carbonate was dissolved to $5 \times 10^5 M$.

As the diacetylene compound 1, manganese salt of 2,4-tricosadiynoic acid represented by the following formula:

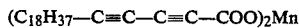

$(C_{18}H_{37}-C\equiv C-C\equiv C-COO)_2Mn$ was dissolved at a concentration of $1 \times 10^{-3}M$ in chloroform, and 200 $\mu l$ of the solution was spread over the aqueous phase 10, and the partitioning plate 11 was moved to enhance the surface pressure to 30 mN/m.

As the substrate 12, a silicon wafer having aluminum vapor deposited thereon was used.

On this substrate, film formation was effected similarly as in Example 1.

The polymerizable film was subjected to exposure by use of PLA520FA produced by Canon. At a wavelength of 290 nm and a luminance of 13 mW/cm$^2$, drawing was conducted by varying the exposure time from 5 seconds to 40 seconds.

After development with ethanol, the film thickness after development was measured to determine sensitivity, and a curve similar to FIG. 2 was obtained. At $D_{0.5}$, the exposure time became about 5 seconds, and thus it was confirmed that the film obtained was a resist film having a sensitivity which was higher by far than the resist film of the prior art.

EXAMPLE 1-3

As the aqueous phase 10, an aqueous $1 \times 10^{-4}M$ cadmium chloride solution was employed, and further sodium hydrogen carbonate was dissolved to $5 \times 10^{-5}M$.

As the diacetylene derivative compound, 22,24-pentacosadiynoic acid represented by the following formula:

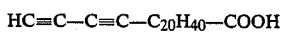

$HC\equiv C-C\equiv C-C_{20}H_{40}-COOH$ was dissolved at a concentration of $1 \times 10^{-3}M$ in chloroform, and the partitioning plate was moved to enhance the surface pressure to 40 mN/m.

As the substrate 12, a silicon wafer of which surface was thermally oxidized to a SiO$_2$ film of 1000 Å A was employed.

After film formation according to the same method as described above, the film was dipped in an aqueous manganese solution and left to stand for 1 hour.

As the result of measurement of the monomolecular built-up film by atomic absorption analysis, it was confirmed that cadmium in the monomolecular built-up film was replaced with manganese.

This polymerizable film was polymerized with UV-ray of 254 nm, and was found that the polymerization rate and the polymerization yield were better by far than other metals.

EXAMPLE 2-1

The same polymerizable film was formed on the substrate as in Example 1-2, and was polymerized with UV-ray of 254 nm. As the result, the solid phase polymerization occurred to form a first insoluble state.

Next, electron beam was irradiated following a pattern to the total dose of 8 $\mu C/cm^2$, followed by development with ethanol for 5 minutes.

As the result, a positive type pattern of high contrast and high resolving power was formed.

EXAMPLE 2-2

The same polymerizable film was formed on the substrate as in Example 1-3, and was placed in the same electron beam drawing device as in Example 1-1, and subjected to patterning by use of two electron beam doses of 8 $\mu C/cm^2$ and 100 $\mu C/cm^2$, followed by development with ethanol.

As the result, the site at the dose of 8 $\mu C/cm^2$ was dissolved, while the site at the dose of 100 $\mu C/cm^2$ became insoluble to leave the film.

When this film was subjected to etching in a plasma of carbon tetrafluoride, SiO$_2$ coating was etched at the site of the dose of 8 $\mu C/cm^2$ to have the subbing silicon exposed, while 1000 Å of the SiO$_2$ coating remained at the site of the dose of 100 $\mu C/cm^2$. Thus, excellent etching resistance was confirmed.

EXAMPLE 3-1

As the substrate 12, one subjected to the following treatment was employed.

The oxide film was removed from the surface of the n+ type silicon wafer doped with antimony (resistance value 0.010–0.011 $\Omega cm^{31\ 1}$) with hydrofluoric acid, and PIG (a polyimide type resist) was applied to a thickness of 1 $\mu m$ thereon by use of a spinner, etc., followed by curing at 250° C. On this film was further applied siloxane to a thickness of 0.1 $\mu m$.

The substrate having the above resist on the surface was moved gently vertically at a speed of 10 mm/min in the direction transversing the water surface to form a monomolecular built-up film of 30 layers having the same components as in Example 1-1.

Next, after drawing lines with a line thickness and interlinear space of 1 $\mu m$–0.1 $\mu m$ on the layer having this monomolecular built-up film by use of two electron beam doses of 0.4 $\mu C/cm^2$ and 8 $\mu C/cm^2$, development was effected with ethanol for 5 minutes.

After thus forming a pattern comprising a monomolecular built-up film, the siloxane film was etched by use of a plasma of carbon tetrafluoride, ard subsequently PIG was etched by use of a plasma of oxygen.

As the result, a pattern of extremely high contrast and yet with a resolving power of 0.2 $\mu m$ could be formed.

EXAMPLE 3-2

As the substrate 12, a silicon wafer having aluminum vapor deposited to 1000 Å thereon was coated with AZ1350J to a thickness of 2 μm and, after post-baking at 20° C., further titanium was vapor deposited to a thickness of 0.3 μm thereon.

By use of the resist coated substrate, a monomolecular built-up film having the same components as in Example 1-2 was formed.

When this monomolecular built-up film was polymerized with a UV-ray of 254 nm, the solid phase polymerization occurred to give a first insoluble state.

Next, electron beam was projected following a pattern to the total dose of 8 μC/cm$^2$, followed by development with ethanol for 5 minutes.

After having thus formed a pattern comprising a monomolecular built-up film, the titanium film was etched by use of a plasma of carbon tetrafluoride, and subsequently AZ1350J was etched by use of a plasma of oxygen.

As the result, a positive type pattern of high contrast and high resolving power was formed.

EXAMPLE 3-3

As the substrate 12, on the silicon wafer of which surface was thermally oxidized to form SiO$_2$ film of 1000 Å thereon, 2 μm of polymethyl methacrylate (PMMA) was applied in the same manner as in Example 1-3 to a thickness of 2 μm, followed further by coating of siloxane to a thickness of 0.1 μm thereon.

After film formation according to the same method as in Example 1-3, the film was dipped in an aqueous manganese solution and left to stand for 1 hour.

The resist coated substrate having the layer containing the monomolecular built-up film was placed in the same electron beam lithography system as in Example 1-1, and patterning was effected by use of two electron beam doses of 8 μC/cm$^2$ and 100 C/cm$^2$, followed by development with ethanol.

As the result, the site of the dose 8 μC/cm$^2$ was dissolved, and the site of the dose 100 μC/cm$^2$ made insoluble to leave the film.

When this was subjected to etching in a plasma of carbon tetrafluoride and then in a plasma of oxygen, the SiO$_2$ coating was etched at the site of the dose 8 μC/cm$^2$ to have the subbing silicon exposed, while the SiO$_2$ coating of 1000 Å remained at the site of the dose 100 μC/cm$^2$. Thus excellent etching resistance was confirmed.

EXAMPLE 4-1

A polymerizable film was formed in the same manner as in Example 1-1, and the polymerizable film was exposed to an X-ray by passing the X-ray generated under the conditions of a voltage of 20 KV and a current of 48 mA by use of Rh bulb (wavelength 4.6 Å) produced by Machlett Co. through a window of Be in a vacuum of 6×10$^{-2}$ torr or higher for 1 minute (20 mJ/cm$^2$) to draw a line with a line thickness and space of 0.3 μm, followed by development with ethanol for 5 minutes.

As the result, a pattern of extremely high contrast and yet with a resolving power of 0.3 μm could be formed.

EXAMPLE 4-2

A polymerizable film was formed in the same manner as in Example 1-2. This polymerizable film was exposed to X-ray under the same conditions as in Example 4-1 (the exposure time was 1 minute) to effect polymerization. As the result, the solid phase polymerization occurred to give a first insoluble state. Next, it was exposed to an X-ray under the same conditions as in Example 4-1 (but the exposure time was 30 sec.) following a pattern, followed by development with ethanol for 5 minutes.

As the result, a positive type pattern of high contrast and high resolution was formed.

The polymerizable film of the present invention has the following effects.

1. Adhesion to a substrate is excellent.
2. Film quality is uniform and dense.
3. When used as the resist material, a pattern of high resolving power and high contrast can be formed.

Also, as compared with the resist material of the prior art, sensitivity is higher (with $D_{0.5}$ being about 0.1 μC/cm$^2$ or lower), and the throughput of the electron beam drawing is increased to improve productivity.

4. When used as recording material, rewriting, addition of writing are possible, and recording of high density, high sensitivity and high resolving power is possible.

Consequently, beam current can be reduced to lower temperature elevation.

5. Not only as the resist material, but it is also useful as printing plates for printing, thin film insulators, semiconductors, conductors.

The pattern forming method of the present invention has the following effects.

6. Due to excellent adhesion to substrate, etching resistance is excellent.
7. Due to uniform and dense film quality, a pattern of high sensitivity, high resolving power and high contrast can be formed.
8. Since an UV-ray and an electron beam can be used in combination for pattern formation, the drawing time can be shortened to a great extent.
9. A positive type or negative type pattern can be formed easily as desired.
10. By use of a layer comprising a monomolecular film or a monomolecular built-up film as the upper layer of a multi-layer resist system, pinholes of the upper layer and adhesiveness between layers which have been the problems in the multi-layer resist system of the prior art can be overcome.
11. Since the layer having a monomolecular film or a monomolecular built-up film of a polymerizable compound containing a transition metal is laminated through an intermediate layer on the substrate, short circuit caused by the metal will never occur.

What we claim is:

1. A polymerizable film, comprising a transition metal selected from the group consisting of manganese, chromium, iron, cobalt, nickel, and copper, and a polymerizable compound, and having a solubility in a solvent which changes through a maximum and a minimum with increase in energy imparted for polymerization.

2. A polymerizable film according to claim 1, wherein said film passes through repeatedly a soluble state and an insoluble state in the solvent with increase of energy imparted.

3. A polymerizable film according to claim 1, wherein said polymerizable compound is formed into a film by a monomolecular built-up method.

4. A polymerizable film according to claim 1, wherein said energy for polymerization is at least one of heat, a near UV-ray, a UV-ray, a far UV-ray, an electron beam, a soft X-ray and an X-ray.

5. A polymerizable film according to claim 1, wherein said a transition metal is manganese.

6. A polymerizable film according to claim 1, wherein the polymerizable film containing a transition metal and a polymerizable compound is formed into a film by use of a transition metal salt of a polymerizable compound.

7. A polymerizable film according to claim 1, wherein the polymerizable film containing a transition metal and a polymerizable compound is formed by forming a film of a polymerizable compound in a solution containing a transition metal, and then incorporating the transition metal into the polymerizable compound layer.

8. A polymerizable film according to claim 1, wherein the polymerizable film containing a transition metal and a polymerizable compound is obtained by forming a film of a polymerizable compound and then dipping the formed film into a solution containing a transition metal.

9. A polymerizable film according to claim 1, wherein the polymerizable film containing a transition metal and a polymerizable compound is constituted of a layer of a transition metal and a layer of a polymerizable compound.

10. A polymerizable film according to claim 9, wherein said transition metal layer is formed by vapor deposition or electrolytic plating.

11. A polymerizable film according to claim 9, wherein said polymerizable compound layer is formed by a monomolecular built-up method.

12. A polymerizable film, comprising a transition metal selected from the group consisting of manganese, chromium, iron, cobalt, nickel, and copper, and a polymerizable compound represented by the formula (I) shown below, and also having a solubility in a solvent which changes through a maximum and a minimum with increase in energy imparted for polymerization:

wherein R and $R_1$ are hydrophobic sites, X is a hydrophilic site, and n is 0 or 1.

13. A polymerizable film according to claim 12, wherein said film passes repeatedly through a soluble state and an insoluble state in the solvent with increase in energy imparted.

14. A polymerizable film according to claim 12, wherein said polymerizable compound is formed into a film by a monomolecular built-up method.

15. A polymerizable film according to claim 12, wherein said polymerization energy is at least one of heat, a near UV-ray, a UV-ray, a far UV-ray, an electron beam, a soft X-ray and an X-ray.

16. A polymerizable film comprising a transition metal selected from the group consisting of manganese, chromium, iron, cobalt, nickel, and copper, and a polymerizable compound, and being capable of giving rise to a first soluble state and a second soluble state corresponding to the amount of polymerization energy imparted.

17. A polymerizable film according to claim 16, wherein the second soluble state is greater in solubility in a solvent than the first soluble state.

18. A polymerizable film according to claim 16, wherein said polymerizable compound is a diacetylene compound represented by the formula (I) shown below:

wherein R and $R_1$ are hydrophobic sites, X is a hydrophilic site, and n is 0 or 1.

19. A polymerizable film according to claim 16, wherein said polymerizable compound is formed into a film by a monomolecular built-up method.

20. A polymerizable film according to claim 16, wherein said polymerization energy is at least one of heat, a near UV-ray, a UV-ray, a far UV-ray, an electron beam, a soft X-ray and an X-ray.

21. A polymerizable film having a layer containing a transition metal selected from the group consisting of manganese, chromium, iron, cobalt, nickel, and copper, and a polymerizable compound and an intermediate layer, said layer containing the transition metal and the polymerizable compound being a polymerizable film which changes in solubility in a solvent through a maximum and a minimum with increase of energy given for polymerization.

22. A polymerizable film according to claim 21, wherein said film passes repeatedly through a soluble state and an insoluble state in the solvent with increase in energy imparted.

23. A polymerizable film according to claim 21, wherein said polymerizable compound is formed by a monomolecular built-up method.

24. A polymerizable film according to claim 21, wherein said polymerization energy is at least one of heat, a near UV-ray, a UV-ray, a far UV-ray, an electron beam, a soft X-ray and an X-ray.

25. A method of forming a pattern comprising preparing a polymerizable film comprising a transition metal and a polymerizable compound having a solubility in a solvent which changes repeatedly through a soluble state and an insoluble state with increase in energy imparted and imparting variations in energy to the film to form a soluble site and an insoluble site.

26. A pattern forming method according to claim 25, wherein said polymerizable compound is a diacetylene compound represented by the formula (I) shown below:

wherein R and $R_1$ are hydrophobic sites, X is a hydrophilic site, and n is 0 or 1.

27. A pattern forming method according to claim 25, wherein said polymerizable compound is formed into a film by a monomolecular built-up method.

28. A pattern forming method according to claim 25, wherein said polymerization energy is at least one of heat, a near UV-ray, a UV-ray, a far UV-ray, an electron beam, a soft X-ray and an X-ray.

29. A method of forming a pattern comprising preparing a polymerizable film comprising a transition metal and a polymerizable compound having a solubility in a solvent which changes repeatedly through a soluble state and an insoluble state with increase in energy imparted and imparting variations in energy to the film to form a first insoluble site and a second soluble site.

30. A pattern forming method according to claim 29, wherein said polymerizable compound is a diacetylene derivative compound represented by the formula (I) shown below:

$$R-C\equiv C-C\equiv C-(R_1)_n-X \quad (I)$$

wherein R and $R_1$ are hydrophobic sites, X is a hydrophilic site, and n is 0 or 1.

31. A pattern forming method according to claim 29, wherein said polymerizable compound is formed into a film by a monomolecular built-up method.

32. A pattern forming method according to claim 29, wherein said polymerization energy is at least one of heat, a near UV-ray, a UV-ray, a far UV-ray, an electron beam, a soft X-ray and an X-ray.

33. A method of forming a pattern comprising preparing a polymerizable film comprising a transition metal and a polymerizable compound having a solubility in a solvent which changes repeatedly through a soluble state and an insoluble state with increase in energy imparted and imparting variations in energy to the film to form a second soluble site and a second insoluble site.

34. A pattern forming method according to claim 33, wherein said polymerizable compound is a diacetylene derivative compound represented by the formula (I) shown below:

$$R-C\equiv C-C\equiv C-(R_1)_n-X \quad (I)$$

wherein R and $R_1$ are hydrophobic sites, X is a hydrophilic site, and n is 0 or 1.

35. A pattern forming method according to claim 33, wherein said polymerizable compound is formed into a film by a monomolecular built-up method.

36. A pattern forming method according to claim 33, wherein said polymerization energy is at least one of heat, a near UV-ray, a UV-ray, a far UV-ray, an electron beam, a soft X-ray and an X-ray.

37. A pattern forming method, comprising a step of providing a layer comprising a monomolecular film of a polymerizable compound containing a transition metal or a built-up film thereof by way of an intermediate layer on a substrate, and a step of polymerizing in shape of a pattern by imparting energy to said layer.

38. A pattern forming method according to claim 37, wherein said layer passes through a maximum and a minimum in its solubility with increase in energy imparted.

39. A pattern forming method according to claim 37, wherein said layer passes through a soluble state and an insoluble state with increase in energy imparted.

40. A pattern forming method according to claim 37, wherein said polymerizable compound is a diacetylene compound represented by the formula (I) shown below:

$$R-C\equiv C-C\equiv C-(R_1)_n-X \quad (I)$$

wherein R and $R_1$ are hydrophobic sites, X is a hydrophilic site, and n is 0 or 1.

41. A pattern forming method according to claim 37, wherein said polymerization energy is at least one of heat, a near UV-ray, a UV-ray, a far UV-ray, an electron beam, a soft X-ray and an X-ray.

42. A method of forming a pattern comprising providing on a substrate an intermediate layer and a layer comprising a monomolecular film of a polymerizable compound containing a transition metal or a built-up film thereof, the compound having a solubility in solvent which changes repeatedly through a soluble state and an insoluble state with increase in energy imparted, and imparting variations in energy to the layer to form a first insoluble site and a second soluble site.

43. A pattern forming method according to claim 42, wherein said polymerizable compound is a derivative compound represented by the formula (I) shown below:

$$R-C\equiv C-C\equiv C-(R_1)_n-X \quad (I)$$

wherein R and $R_1$ are hydrophobic sites, X is a hydrophilic sites, and n is 0 or 1.

44. A pattern forming method according to claim 42, wherein said polymerization energy is at least one of heat, a near a UV-ray, a UV-ray, a far UV-ray, an electron beam, a soft X-ray and an X-ray.

45. A method of forming a pattern comprising providing on a substrate an intermediate layer and a layer comprising a monomolecular film of a polymerizable compound containing a transition metal or a built-up film thereof, the compound having a solubility in a solvent which changes repeatedly through a soluble state and an insoluble state with increase in variations in energy imparted, and imparting energy to the layer to form a second solubilized site and a second insolubilized site.

46. A pattern forming method according to claim 45, wherein said polymerizable compound is a diacetylene compound represented by the formula (I) shown below:

$$R-C\equiv C-C\equiv C-(R_1)_n-X \quad (I)$$

wherein R and $R_1$ are hydrophobic sites, X is a hydrophilic site, and n is 0 or 1.

47. A pattern forming method according to claim 45, wherein said polymerization energy is at least one of heat, a near a UV-ray, a UV-ray, a far UV-ray, an electron beam, a soft X-ray and an X-ray.

* * * * *

UNITED STATES PATENT AND TRADEMARK OFFICE
CERTIFICATE OF CORRECTION

PATENT NO. : 4,798,740
DATED : January 17, 1989
INVENTOR(S) : YOSHINORI TOMIDA, ET AL.

It is certified that error appears in the above-identified patent and that said Letters Patent is hereby corrected as shown below:

COLUMN 8

Line 9, "EXAMPLE 1-2" should read --EXAMPLE 1-1--.

COLUMN 10

Line 47, "0.010-0.011 $\Omega cm^{31\ 1}$) should read --0.010-0.011 $\Omega cm^{-1}$)--.

Signed and Sealed this

Thirty-first Day of July, 1990

*Attest:*

HARRY F. MANBECK, JR.

*Attesting Officer*  *Commissioner of Patents and Trademarks*